United States Patent
Chan et al.

(10) Patent No.: US 7,240,711 B2
(45) Date of Patent: Jul. 10, 2007

(54) APPARATUS AND METHOD FOR ALIGNMENT OF A BONDING TOOL

(75) Inventors: Lai Wa Helen Chan, Kwai Chung (HK); Siu Hong Choy, Kwai Chung (HK); Chou Kee Peter Liu, Kwai Chung (HK); Ming Wai Kelvin Ng, Kwai Chung (HK); Yuk Cheung Au, Kwai Chung (HK)

(73) Assignee: ASM Assembly Automation Ltd., Hong Kong (CN)

( * ) Notice: Subject to any disclaimer, the term of this patent is extended or adjusted under 35 U.S.C. 154(b) by 0 days.

(21) Appl. No.: 10/762,826

(22) Filed: Jan. 21, 2004

(65) Prior Publication Data

US 2005/0155712 A1 Jul. 21, 2005

(51) Int. Cl.
*B32B 41/00* (2006.01)
*G01L 5/16* (2006.01)

(52) U.S. Cl. .................. 156/358; 156/360; 156/351; 73/1.15; 73/862.361

(58) Field of Classification Search ............... 156/351, 156/358, 360, 378, 379; 73/1.15, 862.381; 702/41, 42, 44, 97
See application file for complete search history.

(56) References Cited

U.S. PATENT DOCUMENTS

| | | | | |
|---|---|---|---|---|
| 5,985,064 A | * | 11/1999 | Sato | 156/64 |
| 6,179,938 B1 | | 1/2001 | Mannhard et al. | 156/64 |
| 6,347,555 B1 | * | 2/2002 | Namerikawa et al. | 73/862.637 |
| 6,523,423 B1 | * | 2/2003 | Namerikawa et al. | 73/862.391 |

FOREIGN PATENT DOCUMENTS

JP 2002-170831 * 6/2002

OTHER PUBLICATIONS

Mizutani Kenji. Machine Translation of JP2002-170831 from JPO database. Jun. 14, 2002. All pages.*

* cited by examiner

*Primary Examiner*—George Koch
(74) *Attorney, Agent, or Firm*—Ostrolenk, Faber, Gerb & Soffen, LLP

(57) ABSTRACT

The invention provides an apparatus and method for aligning a bonding tool. A force sensor having a plurality of force sensing sections is configured to measure a force generated by the bonding tool on the force sensor. Each sensing section is adapted to individually detect an amount of force from a part of the bonding tool acting on that sensing section, so that an alignment of the bonding tool may be determined.

15 Claims, 3 Drawing Sheets

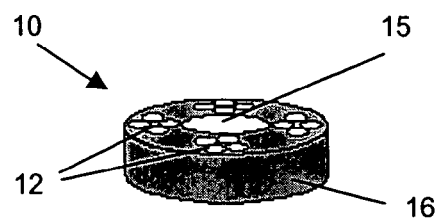
FIGURE 1
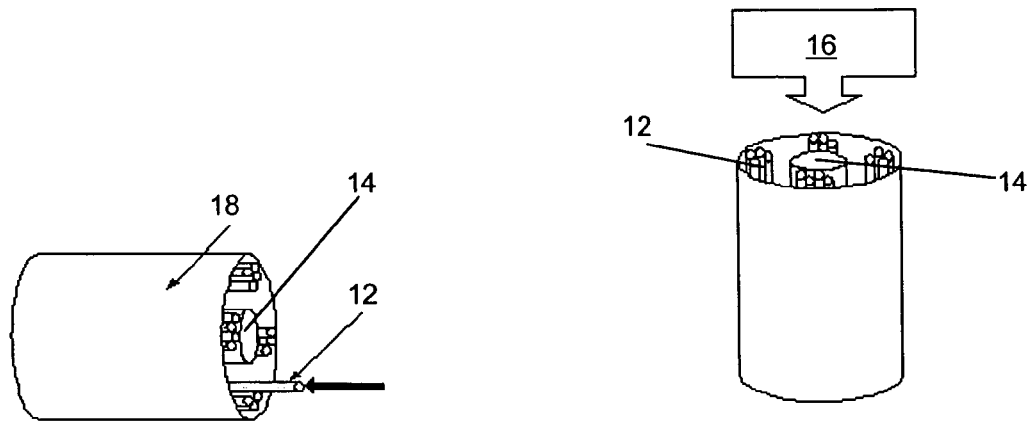
FIGURE 2a
FIGURE 2b
FIGURE 3a Cut view
FIGURE 3b Side view

APPARATUS AND METHOD FOR ALIGNMENT OF A BONDING TOOL

FIELD OF THE INVENTION

The invention relates to an apparatus and method for determining an alignment of a bonding tool, such as a die pick and place tool found on a semiconductor die bonding machine, in particular by utilizing a force sensor.

BACKGROUND AND PRIOR ART

In a die bonding operation in a semiconductor assembly and manufacturing process, a bonding tool may pick up a die (which may be an electronic device such as a semiconductor integrated circuit device or semiconductor chip) at a first location and move the die to a second location at which the die is to be bonded. Commonly, the die is bonded to a substrate, such as a circuit board, or another die. At the bonding location, the bonding tool will move downwardly (this is known as the z-direction) until the die touches the substrate or another die. In order to apply a required bond force during the bond operation, the bonding tool may be driven downwardly further to exert the required force on the die.

Apparatus and methods for controlling this bond force need to meet a number of requirements. For example, they should preferably be able to apply a bond force over a wide range, should be susceptible to feedback and control, and should be able to respond rapidly to required changes in the bond force.

There are demanding requirements placed on die tilt and bond line thickness specifications. The bonding tool usually has a collet that is used to contact a die to be bonded. The collet is often made of metals like stainless steel or tungsten carbide, with a compliant material (such as rubber material) added to the tip of the collet to form a contact surface to hold the die. The collet includes a suction aperture through which a holding force can be provided by air suction. The contacting surface of the collet of the bonding tool should be parallel to a pick-up surface and a placement surface so that a bonding force is evenly distributed onto a die to be picked and placed, and the die can be placed correctly onto a bonding position.

If a bonding tool is not aligned properly, so that the contacting surface is not substantially parallel to the placement surface, die crack or an unacceptable placement error may occur. In order to produce good results, the bonding tool of a modern die bonder needs to be carefully set up to achieve leveling that is better than 16 microns. In other words, a vertical distance between a lowest point on a die and a highest point on the die when carried by the bonding tool must be smaller than 16 microns.

One method of aligning the bonding tool is to mount a circular stamp on the bonding tool and then to land the stamp on a perfectly flat anvil block. A carbon paper is placed on the anvil block to obtain an imprint of the circular stamp. By checking the roundness or completeness of the imprint, an operator is able to visually determine whether the bonding tool has been set up correctly to achieve an acceptable leveling. If the imprint shows an incomplete circle, the operator may correct the alignment of the bonding tool according to the tilting direction of the bonding tool as interpreted from the imprint. This method is manual and not very accurate, since it relies on subjective visual determination by the operator.

Another method of aligning a bonding tool is disclosed in U.S. Pat. No. 6,179,938 for "Method and Apparatus for Aligning the Bonding Head of a Bonder, In Particular a Die Bonder". In this patent, an alignment plate provided with two plane parallel surfaces is placed on a supporting surface which is set plane parallel to the bonding surface upon which the semiconductor chip will be bonded to a carrier material. A measuring device is then calibrated, after which the alignment plate is held at a slight distance above the measuring device. The alignment of the bonding tool is adjusted until the signal from the measuring device is equal to the signal obtained during calibration.

A disadvantage of this method is that there has to be prior calibration each time the bonding tool is to be aligned. The inductive range-finding method used by the alignment apparatus requires prior calibration each time alignment is to be measured, since it uses separate coils that are susceptible in different ways to external influences such as temperature, humidity and so forth. Each coil also forms a magnetic field that may influence the other coils, thus affecting accuracy. Furthermore, the bonding tool has to pick up a specially-prepared alignment plate and move it over the measuring device each time alignment is to be determined. Evidently, closed-loop control to maintain alignment of the bonding tool during bonding will not be possible.

SUMMARY OF THE INVENTION

It is thus an object of the invention to seek to provide a sensor for measuring an alignment of a bonding tool quickly and accurately while avoiding some of the drawbacks of the abovementioned prior art.

According to a first aspect of the invention, there is provided an apparatus for aligning a bonding tool, comprising a force sensor configured to measure a force generated by the bonding tool on the force sensor, wherein the force sensor comprises a plurality of force sensing sections, each sensing section being adapted to individually detect an amount of force from a part of the bonding tool acting on that sensing section.

According to a second aspect of the invention, there is provided a method for aligning a bonding tool, comprising the steps of: providing a force sensor comprising a plurality of force sensing sections, each sensing section being adapted to individually detect an amount of force from a part of the bonding tool acting on that sensing section; causing the bonding tool to generate a force onto the force sensor; measuring the force generated by the bonding tool onto the force sensor; and adjusting an alignment of the bonding tool based upon the amount of force measured by each sensing section.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of an apparatus and method according to the preferred embodiment of the invention will now be described with reference to the accompanying drawings, in which:

FIG. 1 is an isometric view of a piezoelectric force sensor that is usable to detect an alignment of a bonding tool according to the preferred embodiment of the invention;

FIGS. 2a and 2b illustrate schematically one method by which the force sensor of FIG. 1 may be fabricated;

FIGS. 3a and 3b illustrate cross-sectional and side elevation views respectively of a molding apparatus that can be implemented to form the piezoelectric force sensor of FIG. 1;

DETAILED DESCRIPTION OF THE PREFERRED EMBODIMENT

Figure 4:
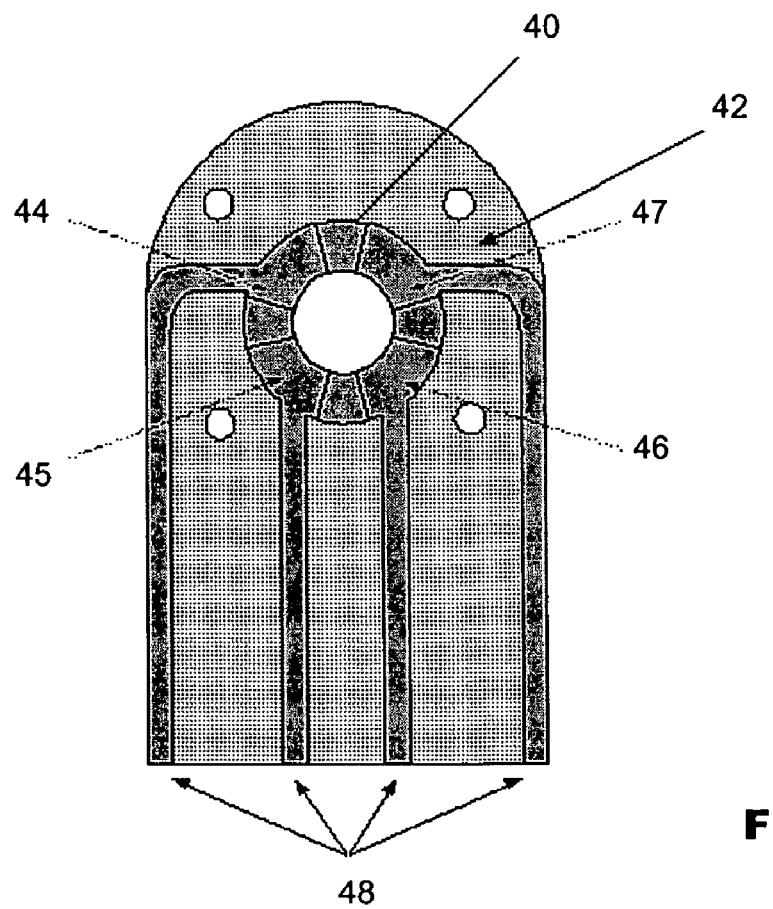
FIG. 4 is a plan view of a polyimide film laid out on a printed circuit board for detecting an output of the force sensor.

FIG. 1 is an isometric view of a piezoelectric force sensor 10 that is usable to detect an alignment of a bonding tool according to the preferred embodiment of the invention. The force sensor 10 comprises a plurality of ceramic fibers 12 with piezoelectric properties that are embedded in hardened epoxy material 16 and extend through to opposite flat surfaces of the force sensor 10. In this embodiment, the force sensor 10 is fabricated in a ring form with a hollow center 15. This ring form is suitable for the specific mounting methods for the apparatus mentioned herein, but it should be appreciated that the force sensor 10 may also take other forms.

In FIG. 1, the ring is nominally divisible into four equal sections or quadrants with a collection of ceramic fibers 12 in each section of the ring. A bundle of four ceramic fibers 12 is grouped into each section. Therefore, it is possible to determine a force exerted on each sensing section of the force sensor 10, relative to the other three sections.

FIGS. 2a and 2b illustrate schematically one method by which the force sensor 10 of FIG. 1 may be fabricated. Referring first to FIG. 2a, a mold 18 is prepared, which has a central shaft 14 which is used to fashion the hollow center 15 of the force sensor 10. Strips of ceramic fibers 12 are then inserted into the mold 18. As shown in FIG. 2b, epoxy 16 is then added into the mold 18 and allowed to harden. The cylindrically-shaped hardened epoxy 16 with embedded ceramic fibers 12 is removed from the mold 18 and central shaft 14, then diced and polished to form a plurality of the ceramic ring illustrated in FIG. 1. Chromium-gold electrodes are then applied to cover the four sensing sections containing the fibers 12. Thereafter, an electric field is applied to the ceramic fibers 12 at an elevated temperature to elicit the piezoelectric properties in the fibers 12.

FIGS. 3a and 3b illustrate cross-sectional and side elevation views respectively of a molding apparatus 20 that can be implemented to form the piezoelectric force sensor 10 of FIG. 1. A base 22 of the molding apparatus 20 is made of stainless steel. Two pieces of Teflon 24 are assembled to form a cube with a shape of a hollow mold 18 at its center. After assembly, the two pieces of Teflon 24 are secured together with screws 26.

A round disc 28 with an outer diameter that is the same as the inner diameter of the mold 18 is inserted into the bottom of the mold 18. A central shaft 14 made of Teflon is inserted into the middle of the mold 18. The central shaft 14 has the same diameter as the hollow center 15 of the force sensor 10 to be formed, and is preferably embedded with steel. The round disc 28 has an inner insert that has a diameter that is the same as the diameter of the central shaft 14. It also contains four groups of smaller holes that have diameters that are the same as the diameter of each of the ceramic fibers 12. Thus, the round disc 28 has inserts that are suitably sized for inserting and positioning both the central shaft 14 and groups of ceramic fibers 12.

After insertion of the central shaft 14 and ceramic fibers 12 into the round disc 28, a top plate 32 with holes corresponding to the positions of the central shaft 14 and ceramic fibers 12 is used to cover the mold 18 and align the ceramic fibers 12. The mold 18 is then filled with epoxy material 16 to form a composite rod. After the epoxy material 16 has been totally cured, the top plate 32 is removed. The screws 26 are unscrewed and the two pieces of Teflon 24 are separated. The cylindrically-shaped composite rod can then be removed from the molding apparatus 20 and the central shaft 24 can be pulled out from its center. Thereafter, the composite rod can be diced to form force sensors 10 in the form of rings as shown in FIG. 1.

In this embodiment, the force sensor 10 comprises a ring with a hollow center and each sensing section is of substantially equal size. Other embodiments of composite wafers by which a suitable sensor comprising separate sections can be fabricated are disclosed in U.S. Pat. No. 6,190,497 entitled "Ultrasonic Transducer", in particular FIG. 4 and FIG. 5 therein. However, the embodiments described herein are not meant to be exhaustive, and other embodiments of force sensors that are configured to sense force distribution exerted on different sections of the sensors are possible.

FIG. 4 is a plan view of a transmitting material comprising a plurality of individual electrical conductors, such as a polyimide film 40. The polyimide film 40 is laid out on an electronic circuit, in the form of a printed circuit board 42 to be coupled to the force sensor 10 for detecting outputs from the force sensor 10. The polyimide film 40 includes four sensing zones 44, 45, 46, 47 made of electrically conductive material, whereat each group of ceramic fibers 12 corresponding to each sensing section of the force sensor 10 are positioned. When a force acts on a surface of the force sensor 10, electrical currents are generated in the respective sensing zones 44, 45, 46, 47 which are channeled to a signal processor on the electronic circuit or printed circuit board 42 connected to signal output terminals 48 formed on the polyimide film 40. Based upon the relative strengths of the electrical currents fed through each of the four output channels of the signal output terminals 48, the relative forces acting on each section of the force sensor 10 are determinable.

Figure 5:
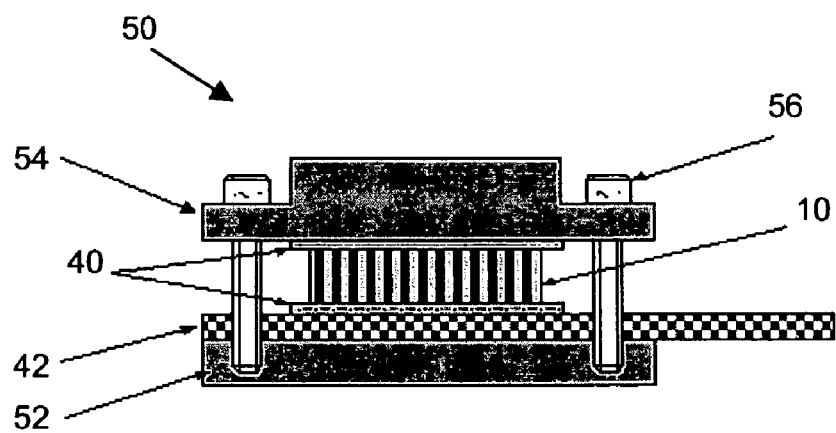
FIG. 5 is a cross-sectional side view of an alignment station incorporating the force sensor for sensing an alignment of a bonding tool according to the preferred embodiment of the invention.

FIG. 5 is a cross-sectional side view of an apparatus for aligning a bonding tool in the form of an alignment station 50 incorporating the force sensor 10 according to the preferred embodiment of the invention. The alignment station 50 is spaced from the bonding tool and may be a stand-alone device. The force sensor 10 has a plurality of force sensing sections, each sensing section being individually adapted to detect an amount of force from a part of the bonding tool acting on that sensing section.

The alignment station 50 comprises a base plate 52, on which is mounted a printed circuit board 42. A layer of polyimide film 40 is laid on top of the printed circuit board 42. A force sensor 10 is positioned on top of the layer of polyimide film 40 such that each group of its ceramic fibers comprised in each sensing section is aligned with the respective electrodes in the sensing zones 44, 45, 46, 47 of the polyimide film 40. Similarly, another layer of polyimide film 40 is positioned on top of the force sensor 10 that has one common electrode for the electrical ground of all its sensor zones. A biasing member or sensing top plate 54 is placed on top of the top layer of polyimide film 40, thereby sandwiching the force sensor 10, polyimide films 40 and printed circuit board 42 between the top plate 54 and base plate 52. Bolts 56 are used to secure the biasing member or top plate 54 to the base plate 52 and to provide a preload force to the top sensing surface of the force sensor 10. In a conventional piezoelectric sensor, the preload force is normally necessary to obtain a substantially linear relationship between force exerted and electrical current produced.

In order to measure an alignment of a bonding tool, the alignment station 50 is secured onto a surface that is plane parallel to a placement surface for semiconductor dice. A collet of the bonding tool is positionable onto the alignment station 50 by lowering it onto the top plate 54 and a predetermined force is exerted onto the top plate 54. Preferably, the top plate 54 has a contact surface area that is larger than but as close as possible to the contact surface of the collet. The force sensor 10 will detect the forces transmitted through the top plate 54 onto each sensing section of the force sensor 10. If there is an equal distribution of forces through all the sensing sections, the bonding tool is properly aligned. If one or more sensing sections detect a greater force than the other sensing sections, the bonding tool is not properly aligned, and the collet needs to be adjusted by moving it towards the direction of the sensing section(s) that detect the greater force. Adjustment is made until a substantially equal distribution of forces is detected.

Figure 6:
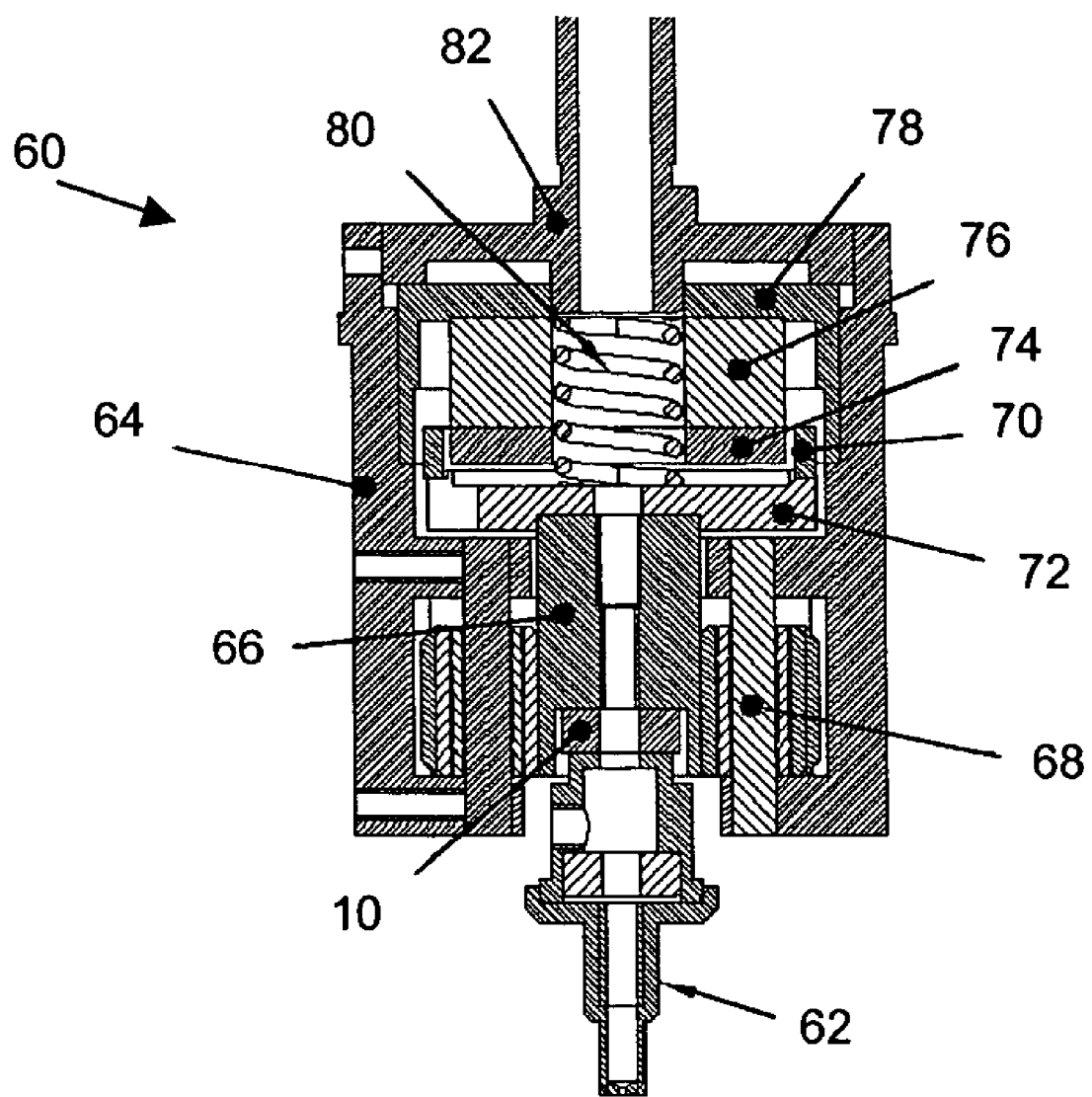
FIG. 6 is a cross-sectional view of a die pick and place tool incorporating the force sensor according to the preferred embodiment of the invention.

FIG. 6 is a cross-sectional view of a bonding tool in the form of a die pick and place tool 60 incorporating the force sensor 10 according to the preferred embodiment of the invention. The force sensor 10 is coupled to the bonding tool. In the arrangement of FIG. 6, a separate alignment station 50 is not required, and closed-loop feedback of the alignment of the pick and place tool 60 can be obtained.

The pick and place tool 60 includes a collet assembly 62. The force sensor 10 is coupled to the collet assembly 62 whereby each sensing section of the force sensor 10 is adapted to detect a reaction force acting on a part of the collet assembly that is generated upon application of a bonding force onto a surface. The force sensor 10 is preferably coupled to the collet assembly 62 axially opposite a point of contact between the collet assembly 62 and the bonding surface. Further, the collet assembly 62 preferably exerts a preload force onto the force sensor 10, the need for which was explained above in relation to FIG. 5.

The collet assembly 62 and force sensor 10 are supported on a slider mount 66 that is slidable on a slider or ball brushing 68. The slider mount 66 allows the collet assembly 62 to slide relative to a bond force actuation unit bracket 64 in order to modulate the bonding force so as to obtain greater control of the bonding force and to avoid damaging dice that are picked and placed by the pick and place tool 60.

A bond force motor coil 70 is mounted onto the bond force actuation unit bracket 64 by a bond force motor coil mount 72. Located adjacent the bond force motor coil 70 are a bond force motor ferromagnetic plate 74, bond force motor magnet 76 and bond force motor ferromagnetic core 78. The various components of the bond force motor 70, 72, 74, 76, 78 essentially form a linear motor that imparts a controllable bonding force onto the collet assembly 62. A compression spring 80 serves to provide a preload force to the collet assembly 62 as against a support datum in the form of a bonder shaft 82. The pick and place tool 60 is connected to a bond head of a bonding machine through the bonder shaft 82.

Using this arrangement, the force sensor 10 can continuously monitor a force exerted on it by the collet assembly 62. When the collet assembly 62 is not pushing against a surface, the force sensor 10 experiences a preload force generated from the collet assembly 62 acting on it. As the collet assembly 62 pushes against a flat horizontal surface, such as a die on a pick-up site or a bonding site, a distribution of forces on each sensing section of the force sensor 10 can be detected. If the pick and place tool 60 is not properly aligned because of an unequal distribution of forces beyond a certain tolerance, an alarm can be generated immediately and the pick and place tool 60 can be realigned either manually, or automatically with suitable additional mechanisms that are configured to realign the pick and place tool 60.

It should be appreciated that this embodiment has an advantage over the separate alignment station 50 of FIG. 5 and the devices of the prior art since real-time closed-loop feedback of the alignment of the pick and place tool can be obtained and any misalignment can be remedied immediately. Time required for alignment of the pick and place tool is also reduced by not having to move the pick and place tool to a separate station each time alignment is to be checked.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for aligning a bonding tool, comprising:
a force sensor configured to measure a force generated by the bonding tool on the force sensor,
wherein the force sensor comprises a plurality of force sensing sections, the force sensing sections being isolated from each other and configured such that each force section is respectively responsive only to compressive forces applied to it by a portion of the bonding tool in contact with that force sensing section, and substantially non-responsive to forces applied to the force sensor from parts of the bonding tool not in contact with that force sensing section,
the apparatus being responsive to differences between the individually detected forces to generate an alignment signal representing departure of the orientation of the bonding tool from the desired alignment.

2. An apparatus as claimed in claim 1, wherein the sensing area of each sensing section is substantially smaller than the area of contact between the bonding tool and the force sensor as a whole.

3. An apparatus as claimed in claim 1, wherein each sensing element is comprised of bundles of ceramic fibers, one end of each bundle being positioned to engage with the bonding tool during operation, and wherein the sensing area of each bundle is substantially smaller than the total contact area of the bonding tool with the force sensor as a whole.

4. An apparatus as claimed in claim 1, including a collection of piezoelectric ceramic material contained in each sensing section for piezoelectrically detecting the force exerted on that sensing section.

5. An apparatus as claimed in claim 1, including a transmitting material comprising a plurality of individual electrical conductors coupled to the force sensor such that positions of the electrical conductors coincide with positions of the force sensing sections and channel current produced by each respective sensing section to a respective output terminal.

6. An apparatus as claimed in claim 5, wherein the transmitting material is coupled to an electronic circuit to which the output terminal are connected for measuring the current produced by each sensing section.

7. An apparatus as claimed in claim 5, wherein the transmitting material is a polyimide film fabricated with a plurality of individual electrical conductors.

8. An apparatus as claimed in claim 1, wherein the force sensor is located at an alignment station spaced from the bonding tool, and the bonding tool is positionable onto the alignment station for alignment.

9. An apparatus as claimed in claim 8, including a biasing member coupled to a sensing surface of the force sensor whereby to exert a preload force on the force sensor.

10. An apparatus as claimed in claim 1, wherein the force sensor is coupled to the bonding tool.

11. An apparatus as claimed in claim 10, wherein the bonding tool includes a collet assembly, and the force sensor is coupled to the collet assembly whereby each sensing section is adapted to detect a reaction force acting on a part of the collet assembly upon application of a force by the bonding tool on a bonding surface.

12. An apparatus as claimed in claim 11, wherein the force sensor is coupled to the collet assembly axially opposite a point of contact between the collet assembly and the bonding surface.

13. An apparatus as claimed in claim 11, wherein the collet assembly exerts a preload force on the force sensor.

14. An apparatus as claimed in claim 1, wherein the force sensor comprises a ring with a hollow center.

15. An apparatus as claimed in claim 1, wherein each sensing area is of substantially equal size.

* * * * *